United States Patent [19]

Sonokawa et al.

[11] Patent Number: 5,269,875
[45] Date of Patent: Dec. 14, 1993

[54] METHOD OF ADJUSTING CONCENTRATION OF OXYGEN IN SILICON SINGLE CRYSTAL AND APPARATUS FOR USE IN THE METHOD

[75] Inventors: Susumu Sonokawa; Kenji Araki; Atsushi Iwasaki, all of Takehu; Masahiko Baba, Annaka, all of Japan

[73] Assignee: Shin-Etsu Handotai Company, Limited, Tokyo, Japan

[21] Appl. No.: 825,443

[22] Filed: Jan. 24, 1992

Related U.S. Application Data

[62] Division of Ser. No. 593,920, Oct. 5, 1990, abandoned.

[30] Foreign Application Priority Data

Oct. 5, 1989 [JP] Japan .................. 1-260710

[51] Int. Cl.$^5$ .............................................. C30B 15/14
[52] U.S. Cl. ........................ 156/605; 156/617.1; 156/620.4; 422/249
[58] Field of Search ............... 156/601, 605, 616.41, 156/617.1, 618.1, 620.3, 620.4; 422/249

[56] References Cited

U.S. PATENT DOCUMENTS

| | | | |
|---|---|---|---|
| 3,493,770 | 2/1970 | Dessauer et al. | 250/206 |
| 4,207,293 | 6/1980 | Scholl et al. | 422/249 |
| 4,330,362 | 5/1982 | Zulehner | 156/617.1 |
| 4,417,943 | 11/1983 | Jacques et al. | 156/601 |
| 4,710,258 | 12/1987 | Latka | 156/601 |
| 4,915,773 | 4/1990 | Kravetsky et al. | 156/601 |

FOREIGN PATENT DOCUMENTS

| | | | |
|---|---|---|---|
| 0285943 | 10/1988 | European Pat. Off. | 156/617.1 |
| 0290854 | 11/1988 | European Pat. Off. | 156/601 |
| 3905626 | 2/1989 | Fed. Rep. of Germany. | |
| 1316707 | 12/1962 | France | 156/617.1 |
| 2329343 | 10/1976 | France. | |
| 546511 | 3/1979 | Japan. | |
| 57-40119 | 8/1982 | Japan. | |
| 222259 | 9/1987 | Japan. | |

OTHER PUBLICATIONS

"Automatic Czochralski Growth, Growth Parameter Measurements and Process Control"; W. Uelhoff; JOurnal of Crystal Growth 65 (1983) pp. 278–279.

Primary Examiner—Olik Chaudhuri
Assistant Examiner—Felisa Garrett
Attorney, Agent, or Firm—Browdy and Neimark

[57] ABSTRACT

Used in a Si crystal pulling apparatus using the Czochralski method, to lower the concentration of oxygen in the Si single crystal without increasing the production cost and to make the concentration substantially even all over the Si single crystal. The crystal 36 is produced by disposing a straightening tube 40 concentrically with and above a quartz crucible 22, letting inert gas flow down through the tube, dipping a seed crystal in Si molten liquid 28 in the quartz crucible and then pulling the seed crystal up. The concentration of oxygen in the Si single crystal is adjusted by controlling the distance H between the surface of the Si molten liquid and the bottom end of the straightening tube in accordance with the pull-up length Y or the pull-up time from a certain growth point of the crystal.

2 Claims, 7 Drawing Sheets

METHOD OF ADJUSTING CONCENTRATION OF OXYGEN IN SILICON SINGLE CRYSTAL AND APPARATUS FOR USE IN THE METHOD

This application is a divisional of application Ser. No. 07/593,920, filed Oct. 5, 1990 now abandoned.

BACKGROUND OF THE INVENTION

1. Field of the Invention

The present invention relates to a method which adjusts the concentration of oxygen in a silicon (Si) single crystal and which is used in a single crystal pulling apparatus using the Czochralski method and to a apparatus for use in the adjusting method.

2. Description of Prior Art

When a Si single crystal is pulled up from Si molten liquid in a quartz crucible using the CZ method, volatile silicon oxide (SiO) is produced by the reaction between the quartz crucible and the Si molten liquid and deposits on an edge of the crucible, the Si single crystal, a pulling shaft and an inside wall of a chamber. The SiO which deposits on the pulling shaft which is ascending while rotating is scraped by an airtight seal ring and falls into the molten liquid below, so that the single crystal being produced is damaged. In order to solve this problem, a method is suggested (in Japanese Examined Patent No. 54-6511) in which a purge tube is hung down to be concentric with the pulling shaft in the chamber, argon (Ar) gas is allowed to flow down in a straightening tube from above, and the SiO which evaporates from the surface of the molten liquid together with the Ar gas is exhausted through the bottom of the chamber.

On the other hand, the SiO is also absorbed into the Si single crystal. Since oxygen in the Si single crystal functions as the main element of gettering effect against impurities intruding in the process of producing an integrated circuit, it has been conventionally thought that a preferable concentration of oxygen in the Si single crystal should be approximately 20 ppma (by ASTM F121-83). However, the integration of a semiconductor device has recently reached a high level, and it has been revealed that oxygen in the Si single crystal causes an oxygen inducing fault (OISF) and a swirl fault. As a result, manufacturers of semiconductor devices need a Si single crystal in which the concentration of oxygen is lower than 15 ppma.

The following methods are provided in order to lower the concentration of oxygen in the Si single crystal:

(A) to reduce the reaction between the Si molten liquid and the quartz crucible by decreasing the number of rotations of the quartz crucible (B) to increase the amount of volatilized SiO by increasing the flow rate of inert gas flowing through the straightening tube (C) to increase the amount of volatilized SiO by lowering the pressure in the chamber However, in the case of the method (A), if the number of rotations is too small, the temperature distribution in the Si molten liquid is prevented from being even. In the method (B), since the flow rate of the inert gas is required to be considerably high (normally, 50-100 l/min increased), its costs are increased. In the case of the method (C), if the pressure is too low, the reaction between the quartz crucible and the Si molten liquid becomes large, the life of the quartz crucible is shortened, and the production costs are increased.

SUMMARY OF THE INVENTION

An object of the present invention is to provide an oxygen concentration adjusting method capable of lowering the concentration of oxygen in a Si single crystal and making the concentration even in the overall length of the Si single crystal without causing the above problems and an apparatus for use in the method.

In order to achieve this object, in a method of the present invention for producing a Si single crystal by mounting a straightening tube above a quartz crucible and concentrically with the quartz crucible, letting inert gas flow down through the straightening tube, dipping a seed crystal in Si molten liquid in the quartz crucible and pulling the seed crystal up, the concentration of oxygen in the Si single crystal is adjusted by controlling the distance between the surface of the Si molten liquid and the bottom end of the straightening tube in accordance with a variable which is either the pull-up length from a growth point of the Si single crystal or the amount of time passed.

If only the flow rate of the inert gas flowing down through the straightening tube is changed, its costs are high, and furthermore, it is difficult for the gas flowing out of the straightening tube to reach the surface of the Si molten liquid because of ascending flow produced by heat or radiation from the surface of the Si molten liquid, and the effect of removing SiO by way of volatilizing from the Si molten liquid is reduced and made unstable.

However, according to the present invention, it is possible to adjust the amount of oxygen brought into the Si single crystal to a low value by stably and smoothly changing the flow speed of the inert gas passing between the bottom end of the straightening tube and the surface of the Si molten liquid, and thereby changing the amount of the SiO volatilized from the Si molten liquid, without changing the flow rate of the inert gas flowing down through the straightening tube. Therefore, it is possible to adjust the concentration of oxygen in the Si single crystal without causing any of the above problems.

The above distance between the surface of the Si molten liquid and the bottom end of the straightening tube can be changed by elevating one or both of the straightening tube and the quartz crucible.

The above method is carried out by the following three apparatuses.

A first apparatus has a quartz crucible containing Si molten liquid therein and a straightening tube which is fixed concentrically with the quartz crucible above the quartz crucible and through which inert gas flows down, and produces a Si single crystal by dipping a seed crystal in the Si molten liquid and pulling the seed crystal up. The first apparatus further comprises a means for measuring a variable which is either the pull-up length from a growth point of the Si single crystal or the amount of time passed, a motor for raising and lowering the quartz crucible, a means for setting a reference value of the distance between the surface of the Si molten liquid and the Si single crystal relative to the variable, a means for calculating a reference value of the elevation speed of the quartz crucible based on the value of the variable and the reference value of the distance, and a means for controlling the rotation speed of the motor so that the elevation speed of the quartz crucible is equal to the reference speed.

Since the straightening tube is fixed, the first apparatus can be produced at a lower cost than a second apparatus.

The second apparatus has a quartz crucible containing Si molten liquid therein and a straightening tube which is disposed concentrically with the quartz crucible above the quartz crucible and through which inert gas flows down, and produces a Si single crystal by dipping a seed crystal in the Si molten liquid and pulling the seed crystal up. The second apparatus further comprises a means for measuring a variable which is either the pull-up length from a growth point of the Si single crystal or the time passed, a motor for elevating the quartz crucible, a means for measuring the level of the straightening tube, a means for setting a reference level of the straightening tube in accordance with the variable, and a means for controlling the rotation speed of the motor so that the level of the straightening tube is equal to the reference level.

Since it is unnecessary to change the level of the surface of the Si molten liquid, the second apparatus can measure the diameter of the growing end of the Si single crystal more precisely than the first apparatus.

A third apparatus is the combination of the first and second apparatuses.

BRIEF DESCRIPTION OF THE DRAWINGS

FIG. 1 is a view showing the main mechanical composition of a single crystal pulling apparatus;

FIG. 2 is a diagram of a surface level control circuit;

FIG. 3 is a flowchart showing the composition of software of a microcomputer 52 shown in FIG. 2; and FIG. 4 is a diagram showing the relationship between the distance Y between the surface and an upper end of a crystal body and the distance H between the surface and the bottom end of a straightening tube.

FIG. 6 is a view showing the main mechanical composition of a single crystal pulling apparatus;

FIG. 7 is a diagram of a straightening tube height control circuit; and

FIG. 8 is a diagram showing the relationship between the time t and the height H of a straightening tube.

DESCRIPTION OF THE PREFERRED EMBODIMENTS

The first embodiment of the present invention will now be described with reference to the drawings.

(1) First Embodiment

Figure 1:
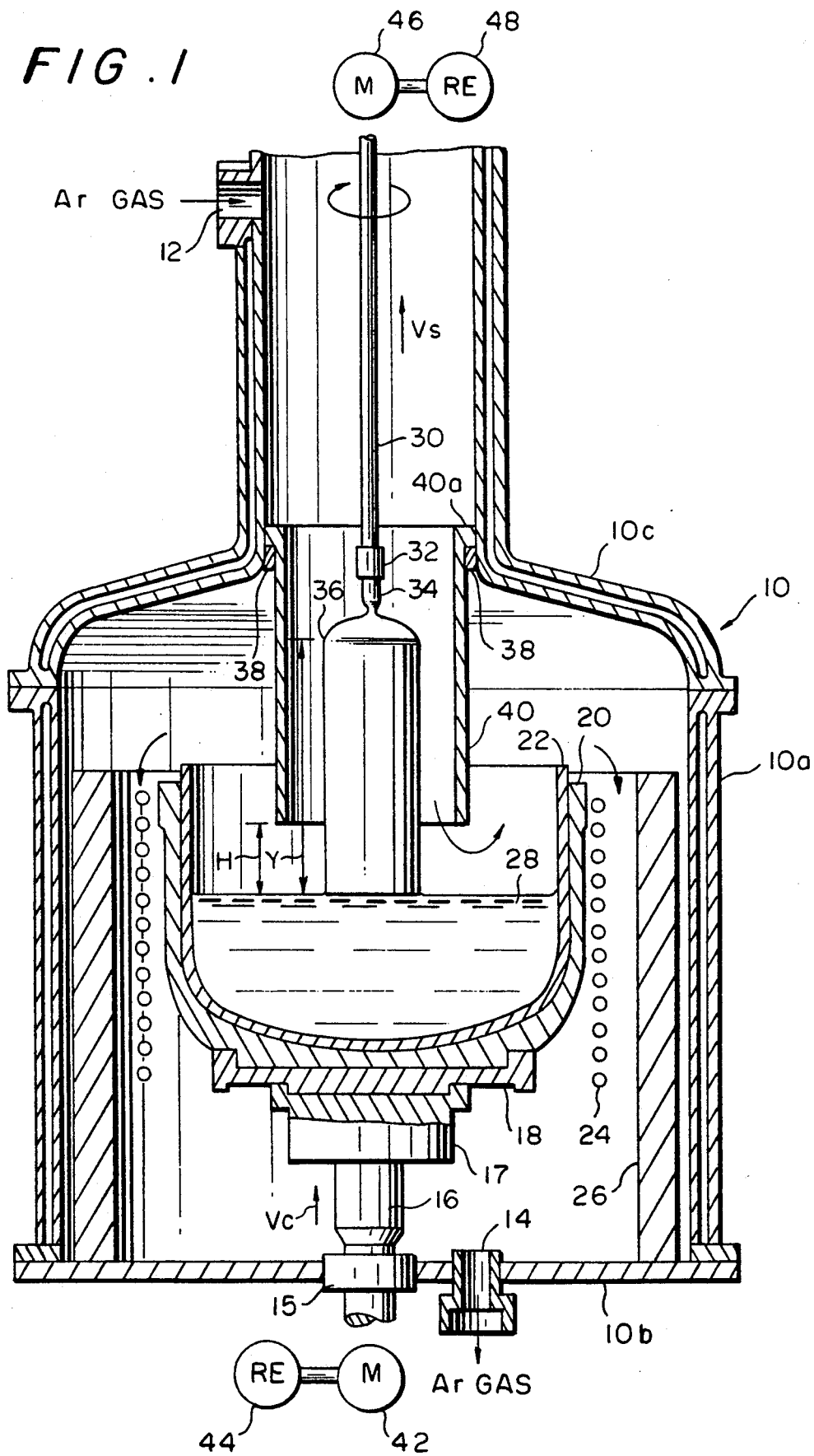
FIGS. 1 to 4 are views of a first embodiment of a method of adjusting the concentration of oxygen in a Si single crystal and an apparatus for use in the method according to the present invention.

FIG. 1 shows the main mechanical composition of a single crystal pulling apparatus.

A bottom opening of a cylindrical body 10a of a chamber 10 is covered with a floor plate 10b, and a lid 10c composed of a shoulder portion and a cylindrical portion having a small diameter is connected to a top opening of the body 10a. An inlet 12 for introducing Ar gas is formed on a side wall of the cylindrical portion of the lid 10c, and an outlet 14 for exhausting the Ar gas is formed on the floor plate 10b. A seal ring 15 is mounted at the center of the floor plate 10b and a rotary elevator shaft 16 pierces through the seal ring 15. A pedestal 17 is fixed at the top end of the rotary elevator shaft 16 and a graphite crucible 20 is laid on the pedestal 17 through a table 18. A quartz crucible 22 is fitted into the graphite crucible 20. The periphery of the graphite crucible 20 is surrounded by a heater 22 and the periphery of the heater 24 is surrounded by a graphite heat-insulating material 26. Therefore, when polycrystals of Si are put into the quartz crucible 22 and electric power is supplied to the heater 24, the Si polycrystals are melted into Si molten liquid 28.

On the other hand, a seed crystal 34 is retained through a seed holder 32 at the bottom of a pulling shaft 30 which is moved up and down along the center line of the chamber 10. By dipping the seed crystal 34 in the Si molten liquid 28 and pulling the seed crystal 34 up, a Si single crystal rod 36 is formed. A plurality of arc stoppers 38 are fixed on the inside wall at the bottom of the cylindrical portion of the lid 10c, and an outward flange 40a formed at the top end of a straightening tube 40 is caught by the arc stoppers 38. In this caught state, the center line of the straightening tube 40 coincides with that of the chamber 10.

The rotary elevator shaft 16 is moved up and down by a motor 42 and the rotary shaft of a rotary encoder 44 is connected to the rotary shaft of the motor 42. Similarly, the pulling shaft 30 is moved up and down by a motor 46 and the rotary shaft of a rotary encoder 48 is connected to the rotary shaft of the motor 46.

Figure 2:
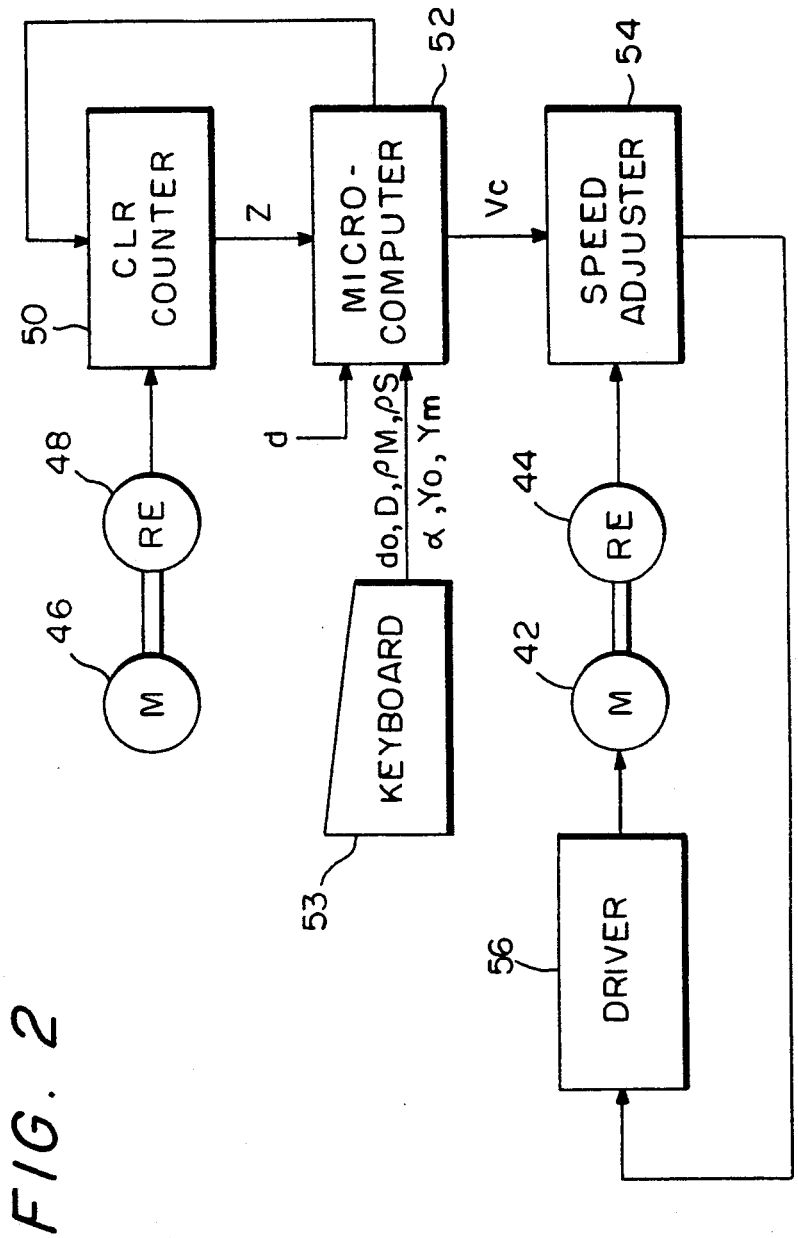

As shown in FIG. 2, output pulses from the rotary encoder 48 are supplied to a counter 50 to be counted and the count value Z of the counter 50 is supplied to a microcomputer 52. Supplied to the microcomputer 52 by operations of a keyboard 53 are a reference diameter $d_O$ of the body of the Si crystal rod 36, the inner diameter D of the quartz crucible 22, the concentration $\rho_M$ of the Si molten liquid, the concentration $\rho_S$ of the Si single crystal, a reference length $Y_m$ of the body and $Y_O$ described below. The diameter d of the growing end of the Si single crystal rod 36 is also supplied to the microcomputer 52. The diameter d is measured by taking a picture of the growing end of the Si single crystal rod 36 by an unillustrated ITV and processing image signals thereof. The microcomputer 52 calculates a reference value Vc of the elevation speed of the rotary elevator shaft 16 by using the above Z, d, $d_O$, D, $\rho_M$, $\rho_S$, $Y_O$ and $Y_m$ and supplies the reference value Vc to a speed adjuster 54. The speed adjuster 54 rotatably drives the motor 42 through a driver 56, measures the elevation speed of the rotary elevator shaft 16 in accordance with output pulses from the rotary encoder 44, and exercises control so that the measured speed equal the reference speed Vc.

The operations of the embodiment having the above composition will be described.

The pressure in the chamber 10 is decreased by a vacuum pump, Ar gas is supplied to the chamber 10 from the inlet 12, and simultaneously, the Ar gas is sucked and exhausted from the outlet 14. The pressure in the chamber 10 is properly set in accordance with the purpose by adjusting the supply amount or the exhaust amount of the Ar gas. Then, electric power is supplied to the heater 24 so as to heat and melt polycrystal silicon in the quartz crucible 22 and form molten liquid 28. Subsequently, the seed crystal 34 is dipped in the molten liquid 28 by lowering the pulling shaft 30 and the single crystal 36 is produced by pulling the pulling shaft 30 up.

At this time, the Ar gas flows down in the straightening tube 40, passes between the bottom end of the straightening tube 40 and the liquid surface 28a and between the outer peripheral surface of the straightening tube 40 and the inside of the quartz crucible 22, is exhausted out of the quartz crucible 22, descends, and is sucked and exhausted from the outlet 14.

Therefore, the volatile SiO produced by the reaction between the molten liquid 28 and the quartz crucible 22 is exhausted from the outlet 14 together with the flow of the Ar gas, so that it is possible to prevent the SiO from depositing on the inner periphery of the quartz crucible 22, the single crystal 36, the seed holder 32, the pulling shaft 30 and so on.

Since the amount of the SiO volatilized from the liquid surface 28 is increased by the flow of the Ar gas and the concentration of oxygen in the single crystal 36 is lowered, the oxygen related faults and swirl faults are reduced. The amount of the volatilized SiO depends upon the flow speed of the Ar gas passing through between the liquid surface 28a and the bottom end of the straightening tube 40.

Figure 3:
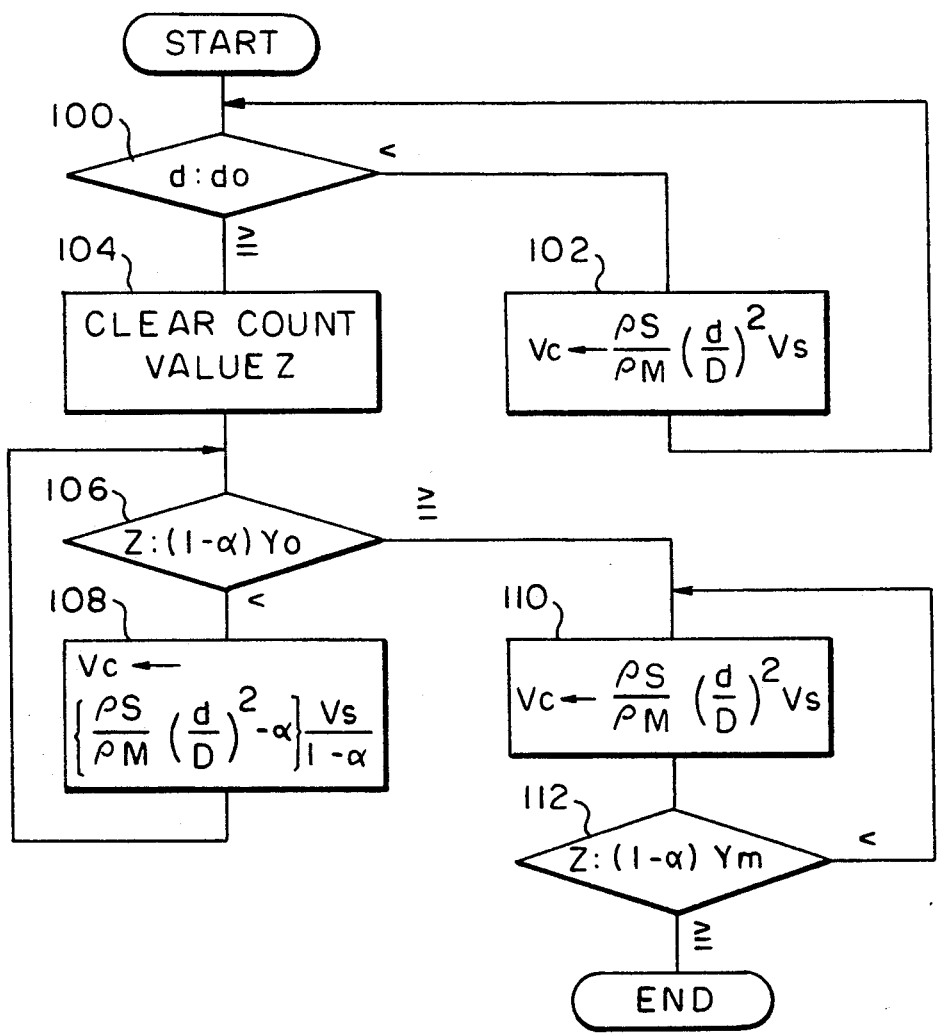
Figure 4:
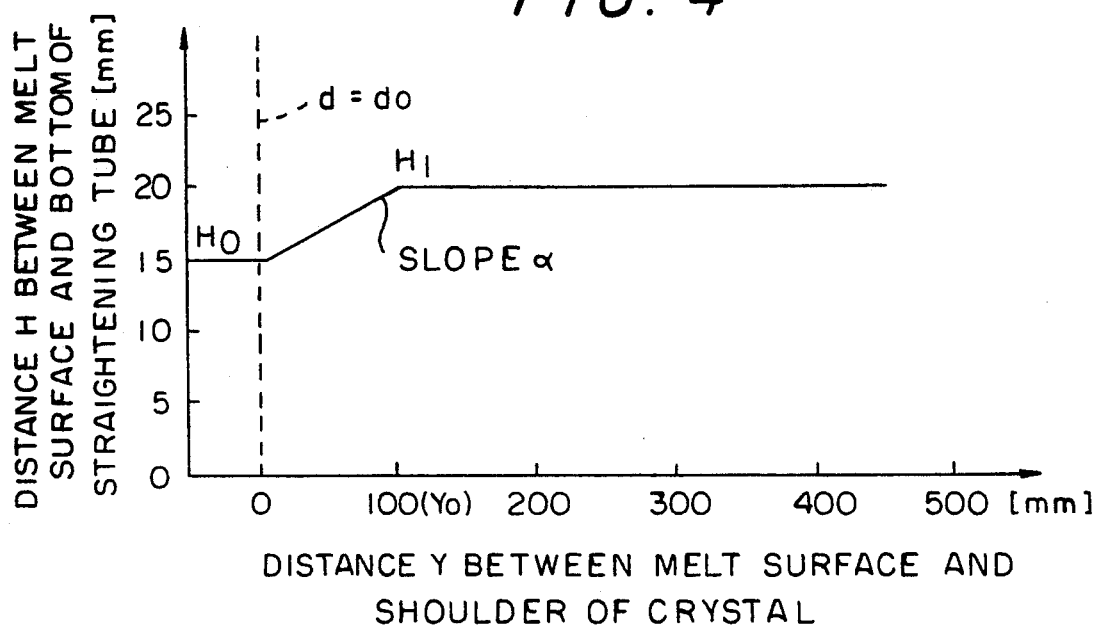

FIG. 4 shows an example of the control of the distance H between the liquid surface 28a and the bottom end of the straightening tube 40 (the liquid surface level H) with respect to the distance Y between the liquid surface 28a and the upper end of the body of the single crystal 36. In this example, the distance H is set at a fixed value $H_0$ since the seeding is performed until the upper end of the body of the Si single crystal rod 36 is detected, and then increased by the ratio $\Delta H/\Delta Y$ ($\Delta$ represents the increment)=$\alpha$ until $Y=Y_0$, and H is set at a fixed value $H_1$ when $Y>Y$. If the pulling speed of the crystal is constant, the equation $\alpha=(H_1-H_0)/Y_0$ is valid, and if the pulling speed is not constant, the equation is approximately valid. FIG. 3 shows the software of the microcomputer 52 for making the supply and exhaust amount of the Ar gas for the chamber 10 constant and controlling the liquid surface level H as shown in FIG. 4.

(Step 100) If $d<dc$, (Step 102) $Vc=(\rho_s/\rho_M)(d/D)^2$ is calculated. The Vc is supplied to the speed adjuster 54 and the level of the liquid surface 28a is set at the fixed value $H_0$. Vs represents the elevation speed of the crystal pulling shaft 30 and is proportional to the time differential value of the count value Z of the counter 50. The proportional constant is 1 hereinafter. The equation $Z=(1-\alpha)Y$ is normally valid. Vs is sometimes used to control the diameter d of the crystal, and in this case, it is substantially constant.

If it is judged in Step 100 that $d \geq d_0$, that is, if the leading end of the body of the Si single crystal rod 36 is detected, (Step 104) A clear pulse is supplied to the counter 50 so as to clear the count value Z.

(Step 106) If $Z<(1-\alpha)Y_0$, (Step 108) $Vc=\{(\rho_S/\rho_M)(d/D)^2-\alpha\}Vs/(1-\alpha)$ is calculated and supplied to the speed adjuster 54 so as to lower the level of the liquid surface 28a at the speed of $\alpha Vs/(1-\alpha)$.

If it is judged in Step 106 that $Z \geq (1-\alpha)Y_0$, (Step 110) $Vc=(\rho_S/\rho_M)(d/D)^2Vs$ is calculated in the same manner as in Step 102, and supplied to the speed adjuster 54 so as to make H at a fixed value $H_2$.

(Step 112) If $Z<(1-\alpha)Y_m$, Step 110 is repeated. If $Z \geq (1-\alpha)Y_m$, the process ends.

(2) Experiment Example

Figure 5:
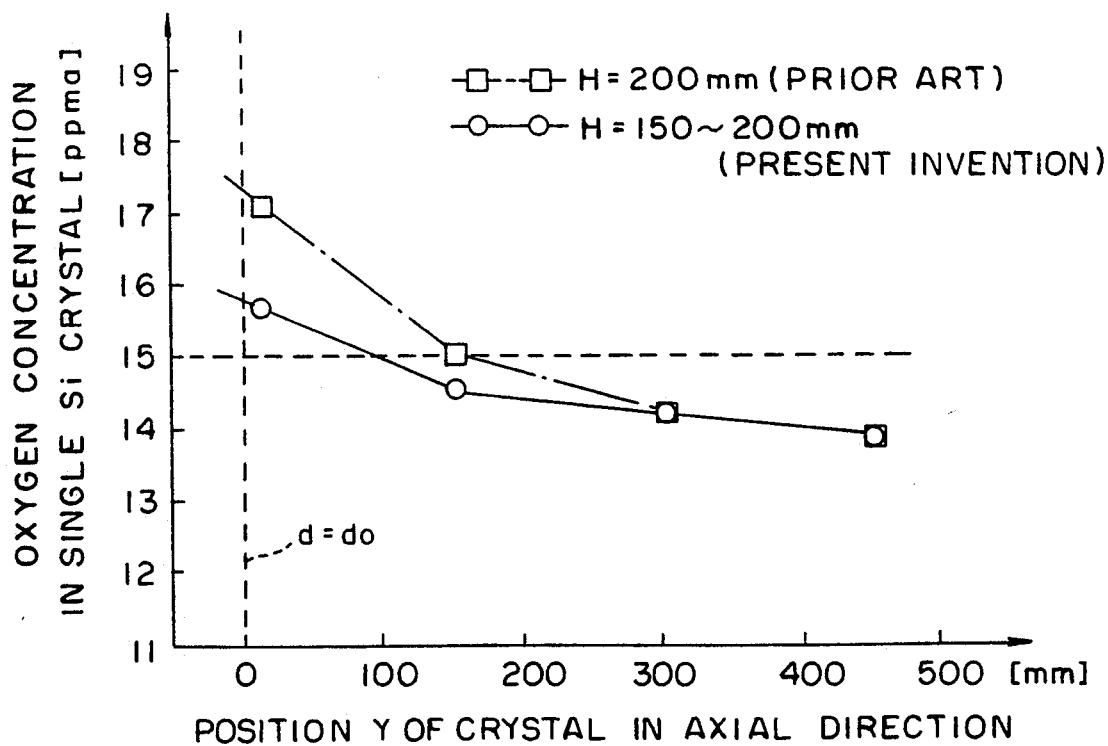
FIG. 5 is a graph of the concentration profile of oxygen in a crystal with respect to the position Y in the axial direction downward from the upper end of the crystal body according to results of experiments using the apparatus of the first embodiment and a conventional apparatus.

FIG. 5 shows the concentration (ppma) of oxygen in the crystal with respect to the position of the leading end of the body of the Si single crystal 36 in the axial direction. Referring to FIG. 5, □ represents the measured value where the level H of the liquid surface is fixed at 200 mm, and ○ represents the measured value where the level H of the liquid surface is changed as shown in FIG. 4. $H_0$ is 15 mm, $H_1$ is 20 mm, and $Y_0$ is 100 mm. In both cases, other conditions are as follows:
Pressure in chamber 10: 30 mbar
Flow rate of Ar gas: 50 l/min
Rotation speed of quartz crucible 22: 6 rpm where $Y=0\sim100$ mm $\{6+(Y-100)/150\}$ rpm where $Y>100$ mm As shown in FIG. 5, for example, if the specification of the concentration of oxygen which the semiconductor device manufacturer requests is 13~15 ppma and the level of the liquid surface is fixed, the portion of the Si single crystal rod 36 of $Y=0\sim15$ cm does not meet the requested specification and results in an inferior product. However, the length of the inferior portion can be reduced by almost half by controlling the level of the liquid surface.

(3) Second Embodiment

Figure 6:
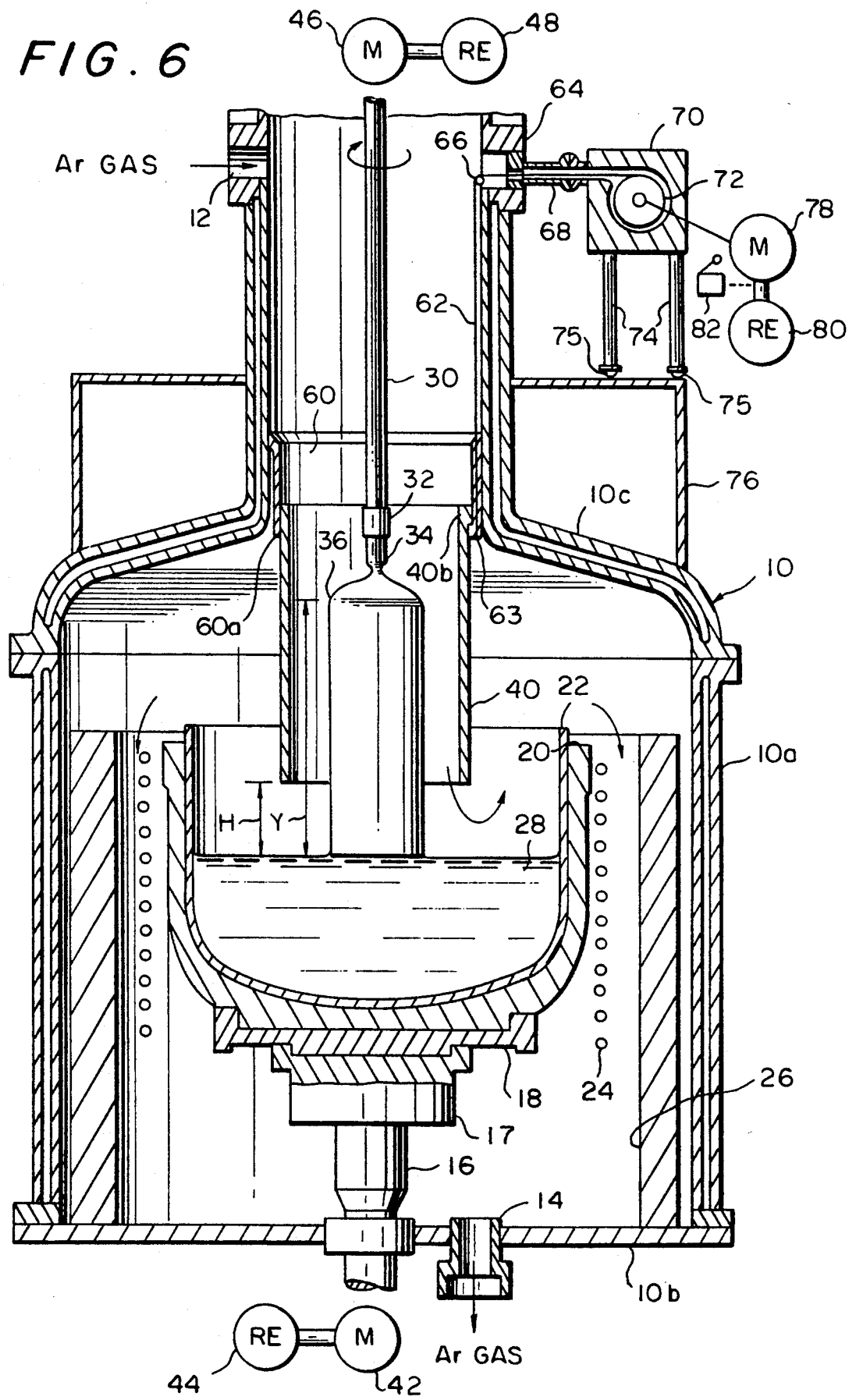
FIGS. 6 to 8 are views of a second embodiment of the present invention.

FIG. 6 shows the main mechanical composition of a single crystal pulling apparatus of a second embodiment.

In this apparatus, an outward flange 40b is formed on the top of the straightening tube 40 and an inward flange 60a is formed at the bottom of a tube holder 60. The outward flange 40b is retained on the inward flange 60a by inserting the straightening tube 40 into the tube holder 60. A piercing hole is formed in parallel with the center line of the tube holder 60 on the side wall of the tube holder 60 and a tungsten wire 62 passes through the hole. A fastening pin 63 is fixed at the bottom end of the tungsten wire 62. The tungsten wire 62 is caught around a guide pulley 66 supported by a joint 64 and drawn outside the joint 64. A housing 70 is connected to the outer end of the joint 64 through a connecting tube 68. A take-up drum 72 is pivotally supported in the housing 70. The tungsten wire 62 passes through the connecting tube 68 and the housing 70 and is wound around the take-up drum 72. The top ends of legs 74 are fixed to the bottom plane of the housing 70, and rubber vibration insulators 75 are mounted under the bottom ends of the legs 74 and on a support stand 76 fixed on the lid 10c.

The take-up drum 72 is rotatably driven by a motor 78. The rotary shaft of a rotary encoder 80 is connected to the rotary shaft of the motor 78, and a cam-type limit switch 82 for detecting the reference position is mounted to the rotary shaft of the motor 78.

Three pairs of constituents having the same composition as that of the constituents 62 to 75, 78 and 80 are disposed 120° apart around the center line of the lid 10c, and represented by the above numerals with A to C to make a distinction between the three pairs.

Figure 7:
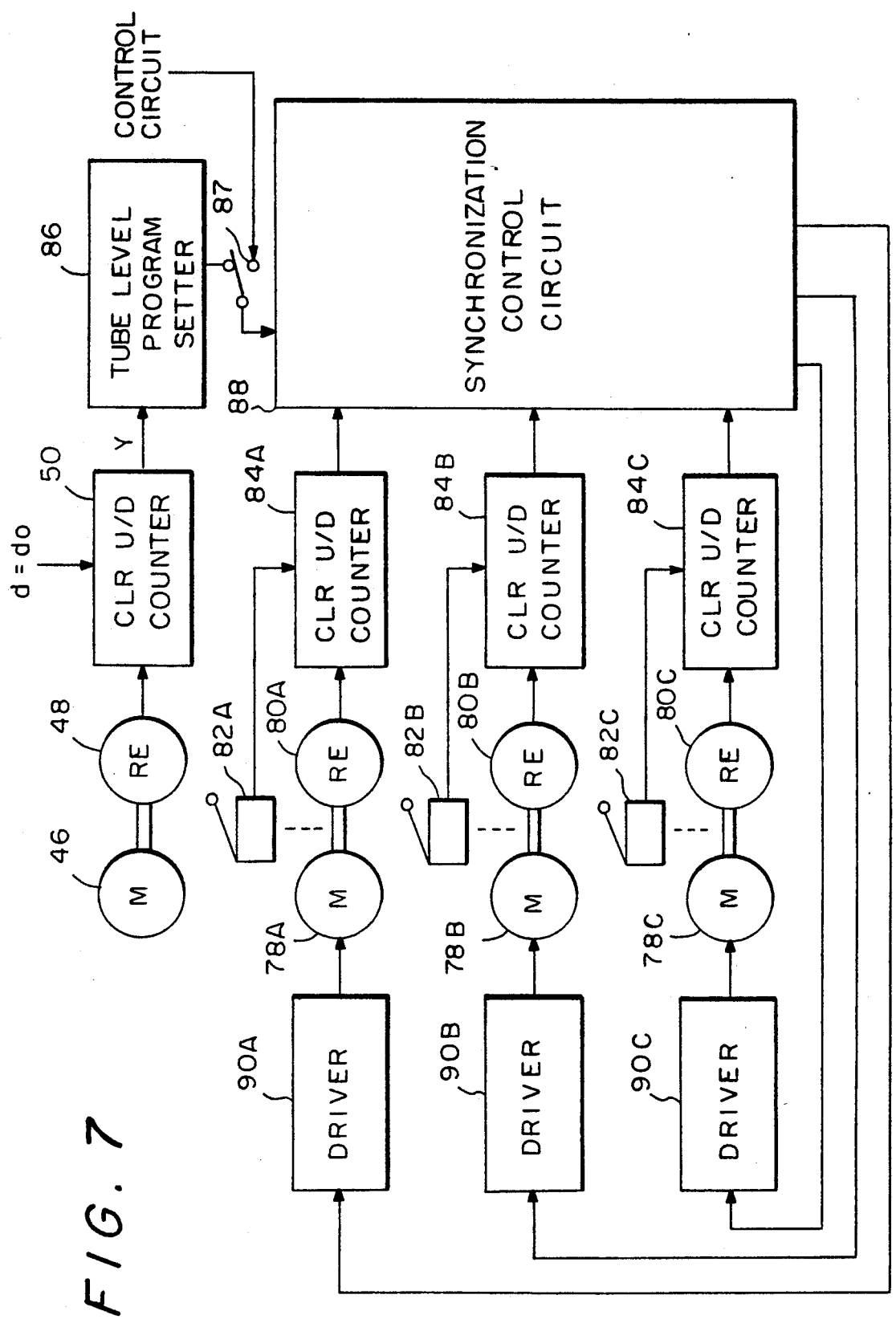

As shown in FIG. 7, the output pulses from the rotary encoders 80 to 80C are supplied to up/down counters 84 to 84C respectively and counted. The count values of the up/down counters 84A to 84C are zero-cleared by reference position detection signals from the limit switches 82A to 82C respectively. On the other hand, the output pulses from the rotary encoder 48 are supplied to the counter 50 so as to be counted in the same manner as shown in FIG. 2. The counter 50 is zero-cleared in response to the detection of $d=d_0$, that is, the detection of the leading end of the body. The count value Y of the counter 50 is supplied to a program setting unit 86, which supplies the height setting value designated by the count value Y to a synchronization control circuit 88 through a selector switch 87. The synchronization control circuit 88 rotatably drives the motors 78A to 78C through drivers 90A to 90C so that each of the count values is equal to the set value.

Figure 8:
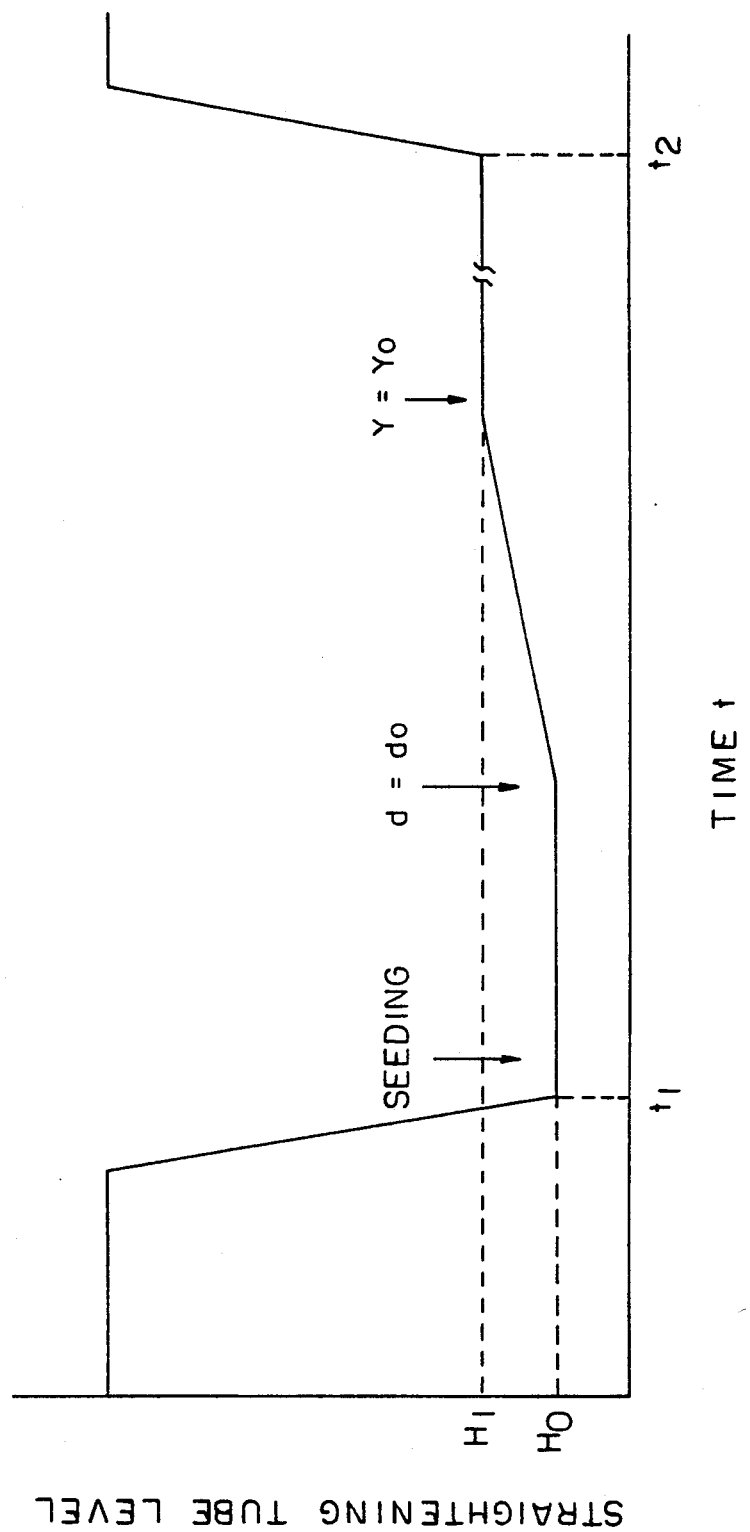

FIG. 8 shows the relationship between the time t and the height H of the straightening tube 40. The selector switch 87 is set on the side of the program setting unit 86 during the time $t_1$ to $t_2$. Before $t_1$ and after $t_2$, the selector switch 87 is set on the side of an unillustrated control circuit. If $t<t_1$, the straightening tube 40 is lowered from its initial position (the reference position) to $H_0$ at constant speed, and if $t<t_2$, it is raised from $H_1$ to the initial position at constant speed.

Although the case in which H linearly increases while $Y=0 \sim Y_0$ is described in the above embodiment, H may curvilinearly increase in relation to the pattern of the rotation speed of the quartz crucible 22 and so on. The curved pattern is determined based on the experiment data in the same manner as the linear pattern.

Needless to say, both the level of the liquid surface and the height of the straightening tube 40 may be controlled in accordance with the purpose.

What is claimed is:

1. In a method of growing a Si single crystal (36) by pulling up the Si single crystal from a molten Si liquid (28) in a quartz crucible (22) with an inert gas flowing down at a constant flow rate through a tube (40) fixed concentrically with the quartz crucible and situated above the molten Si liquid, the Si single crystal being surrounded by the tube, the improvement comprising:

raising said quartz crucible at a speed equal to $(\rho_S/\rho_M)(d/D)^2 V_S$, where $\rho_S$ is a density of said Si single crystal, $\rho_M$ is a density of said molten Si liquid, d is a diameter of said Si single crystal at a surface of said Si molten liquid, D is an inner diameter of said quartz crucible and $V_S$ is a pulling up speed of said Si single crystal, to increase said diameter d until said diameter d becomes a constant diameter $d_0$ while maintaining a distance H between said surface of said molten Si liquid and a bottom end of said tube at a constant $H_0$;

then, when said diameter d reaches a constant diameter $d_0$, raising said crucible at an elevation speed equal to $\{(\rho_S/\rho_M)(d/D)^2-\alpha\}V_S/(1-\alpha)$, where $\alpha$ is a constant, until a pulled up length Y of said Si single crystal becomes a constant length $Y_0$ and increasing said distance H at a constant rate while maintaining said diameter d to be said constant $d_0$; and then, subsequently raising said crucible at an elevation speed equal to $(\rho_S/\rho_M)(d/D)^2 V_S$ so as to keep said distance H to be a constant $H_1 = H_0 \alpha Y_0$ after said second step while maintaining said diameter d to be said constant $d_0$.

2. In a method of growing a Si single crystal (36) by pulling up the Si single crystal from a molten Si liquid (28) in a quartz crucible (22) with an inert gas flowing down at a constant flow rate through a tube (40) fixed concentrically with the quartz crucible above the molten Si liquid, the Si single crystal being surrounded by the tube, the improvement comprising:

raising said quartz crucible at a rate equal to $(\rho_S/\rho_M)(d/D)^2 V_S$, where $\rho_S$ is a density of said Si single crystal, $\rho_M$ is a density of said molten Si liquid, d is a diameter of said Si single crystal at a surface of said Si molten liquid, D is an inner diameter of said quartz crucible and $V_S$ is a pulling up speed of said Si single crystal, to increase said diameter d until said diameter d becomes a constant diameter $d_0$ while maintaining a distance H between said surface of said Si molten liquid and a bottom end of said tube to be a constant $H_0$;

then, when said diameter d reaches a constant diameter $d_0$, raising said crucible at an elevation speed equal to $\{(\rho_S/\rho_M)(d/D)^2-\alpha\}V_S/(1-\alpha)$, where $\alpha$ is a constant, for a constant time to increase said distance H at a constant rate while maintaining said diameter d to be said constant $d_0$; and then, subsequently raising said crucible at an elevation speed equal to $(\rho_S/\rho_M)(d/D)^2 V_S$ so as to keep said distance H at a constant while maintaining said diameter d to be said constant $d_0$.

* * * * *